(12) United States Patent
Little

(10) Patent No.: US 10,461,475 B2
(45) Date of Patent: Oct. 29, 2019

(54) ELECTRICAL RECEPTACLE CONNECTOR WITH GROUNDING PLATES INTERSECTING WITH CONTACT WAFER ASSEMBLY

(71) Applicant: FOXCONN INTERCONNECT TECHNOLOGY LIMITED, Grand Cayman (KY)

(72) Inventor: Terrance F. Little, Fullerton, CA (US)

(73) Assignee: FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 16/038,114

(22) Filed: Jul. 17, 2018

(65) Prior Publication Data

US 2019/0020152 A1    Jan. 17, 2019

Related U.S. Application Data

(60) Provisional application No. 62/533,131, filed on Jul. 17, 2017.

(51) Int. Cl.
| | |
|---|---|
| *H01R 13/6471* | (2011.01) |
| *H01R 13/66* | (2006.01) |
| *H01R 24/60* | (2011.01) |
| *H01R 13/502* | (2006.01) |
| *H01R 13/6587* | (2011.01) |
| *H05K 1/11* | (2006.01) |
| *H05K 1/02* | (2006.01) |
| *H01R 107/00* | (2006.01) |

(52) U.S. Cl.
CPC ....... *H01R 13/6471* (2013.01); *H01R 13/502* (2013.01); *H01R 13/6587* (2013.01); *H01R 13/6658* (2013.01); *H01R 24/60* (2013.01); *H05K 1/117* (2013.01); *H01R 2107/00* (2013.01); *H05K 1/0245* (2013.01)

(58) Field of Classification Search
CPC .............. H01R 13/646; H01R 13/6471; H01R 13/6474; H01R 13/658; H01R 13/6585; H01R 13/6581; H01R 13/6583
See application file for complete search history.

(56) References Cited

U.S. PATENT DOCUMENTS

| | | | | |
|---|---|---|---|---|
| 6,146,202 | A * | 11/2000 | Ramey | ................. H01R 12/585 439/607.1 |
| 7,402,077 | B2 | 7/2008 | Shindo | |
| 7,824,197 | B1 | 11/2010 | Westman et al. | |

(Continued)

*Primary Examiner* — Vanessa Girardi
(74) *Attorney, Agent, or Firm* — Wei Te Chung; Ming Chieh Chang

(57) ABSTRACT

An electrical receptacle connector assembly includes an insulative main housing forming a plurality of mating ports, and a plurality of vertical wafers stacked with one another along a transverse direction in a form that every stacked (differential) signal wafer pair are spaced from the neighboring signal wafer pair by a ground wafer in the transverse direction. The signal wafers and the grounding wafers have corresponding signal contacts and grounding contacts thereon to be exposed upon the corresponding mating ports. A plurality of spring loaded common ground plates extend in the transverse direction so as to reliably mechanically and electrically connect the corresponding grounding wafers at the same time for each common ground plate.

20 Claims, 23 Drawing Sheets

(56) References Cited

U.S. PATENT DOCUMENTS

| | | | |
|---|---|---|---|
| 8,142,207 B1 | 3/2012 | Ljubijankic et al. | |
| 8,371,882 B1 | 2/2013 | Szczesny et al. | |
| 8,540,525 B2 | 9/2013 | Regnier et al. | |
| 8,545,240 B2 | 10/2013 | Casher et al. | |
| 8,747,158 B2 | 6/2014 | Szczesny et al. | |
| 8,764,460 B2 | 7/2014 | Smink et al. | |
| 8,764,464 B2 | 7/2014 | Buck et al. | |
| 8,992,262 B2 | 3/2015 | Pang et al. | |
| 9,246,251 B2 | 1/2016 | Regnier et al. | |
| 9,277,649 B2 | 3/2016 | Ellison | |
| 9,385,479 B1 | 7/2016 | Schmitt et al. | |
| 9,401,570 B2 | 7/2016 | Phillips et al. | |
| 9,431,768 B1 | 8/2016 | Champion et al. | |
| 9,455,530 B2 | 9/2016 | Patel | |
| 9,509,098 B1 | 11/2016 | Henry et al. | |
| 9,509,100 B2 * | 11/2016 | Phillips | H01R 13/6587 |
| 9,531,129 B2 | 12/2016 | de Boer | |
| 9,640,915 B2 | 5/2017 | Phillips et al. | |

* cited by examiner

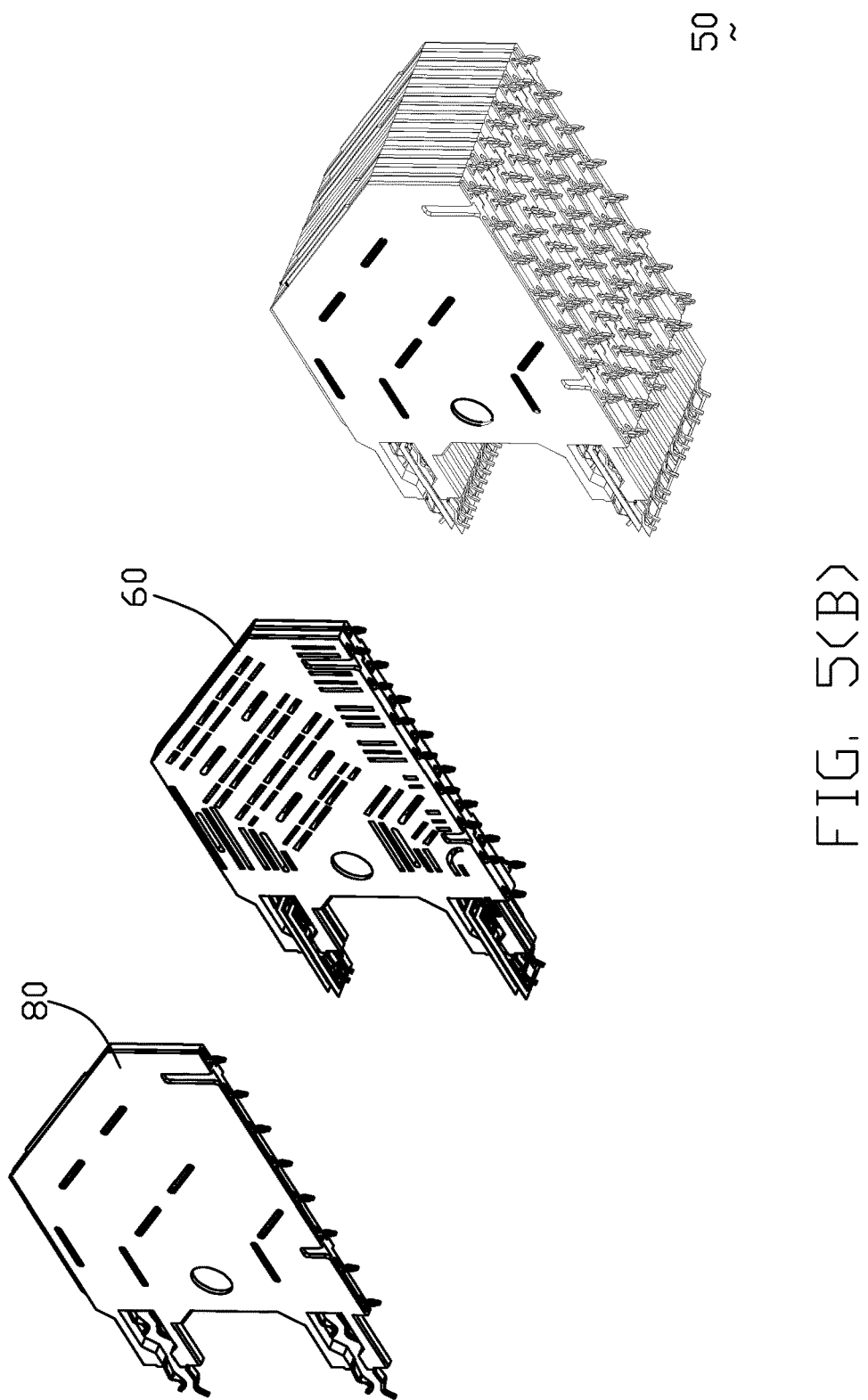

ELECTRICAL RECEPTACLE CONNECTOR WITH GROUNDING PLATES INTERSECTING WITH CONTACT WAFER ASSEMBLY

BACKGROUND OF THE INVENTION

1. Field of the Invention

The present invention relates to an electrical connector assembly, especially to contact wafer assembly thereof and the so-called FP5 connector following the previous designs of which the provisional applications have Ser. Nos. 62/367,098 filed on Jul. 26, 2016, 62/399,272 filed on Sep. 23, 2016, 62/412,841 filed on Oct. 26, 2016, 62/425,627 filed on Nov. 23, 2016, 62/449,133 filed on Jan. 23, 2017, 62/509,141 filed on May 21, 2017, and 62/522,113 filed on Jun. 20, 2017.

2. Description of Related Art

Currently QSFP-DD Specification Rev. 0.1 discloses a 1×1 QSFP-DD module has eight electrical lanes. Each of the eight electrical lanes of the QSFP runs at the rate of 25 Gbit/s or 50 Gbit/s, thereby the QSFP-DD module support 200 Gbit/s or 400 Gbit/s Ethernet applications of. The QSFP-DD module has an electrical receptacle. The electrical receptacle has an insulative housing and four rows of electrical terminals received in the insulative housing. Each of the electrical terminals has a soldering section. Two rows soldering sections of the two top rows of the electrical terminals are offset in a longitudinal direction from two rows soldering sections of the two bottom rows of the electrical terminals. It is noted that another design having the fine pitch of 0.5 mm having the similar interface with QSFP is also presented. It is noted that the single port receptacle connector generally uses the horizontal wafer structures to integrally assemble all the upper row terminals in one wafer structure and all the lower row terminals in another wafer structure. Anyhow, the dual port receptacle connector generally to uses a plurality of vertical wafers stacked with one another in the transverse direction wherein each wafer structure integrally assembling all the upper row and lower row of each port belonging to the same vertical cross-sectional plane. Notably, traditionally, in the dual port receptacle connector the vertical wafer structures requires every two (differential) signal wafers spaced from another two signal wafer with a ground wafer therebetween in the transverse direction.

It is desired to have the superior ground wafer during operation for efficiently removing EMI (Electro-Magnetic Interference) thereof.

SUMMARY OF THE INVENTION

An object of the present invention is to provide an electrical receptacle connector assembly with superior grounding/shielding effect.

To achieve the above-mentioned object, an electrical receptacle connector assembly includes an insulative main housing forming a plurality of mating ports, and a plurality of vertical wafers stacked with one another along a transverse direction in a form that every stacked (differential) signal wafer pair are spaced from the neighboring signal wafer pair by a ground wafer in the transverse direction. The signal wafers and the grounding wafers have corresponding signal contacts and grounding contacts thereon to be exposed upon the corresponding mating ports. A plurality of spring loaded common ground plates extend in the transverse direction so as to reliably mechanically and electrically connect the corresponding grounding wafers at the same time for each common ground plate. The spring loaded common ground plates are assembled to the vertical wafers either in the transverse direction, or in the vertical direction perpendicular to the transverse direction, or in the front-to-back direction perpendicular to both the transverse direction and the vertical direction.

Other objects, advantages and novel features of the invention will become more apparent from the following detailed description when taken in conjunction with the accompanying drawings.

BRIEF DESCRIPTION OF THE DRAWINGS

FIG. 5(B) is another exploded perspective view of the contact wafer assembly of the electrical receptacle connector assembly of FIG. 5(A);

DETAILED DESCRIPTION OF THE PREFERRED EMBODIMENT

Figure 1A:
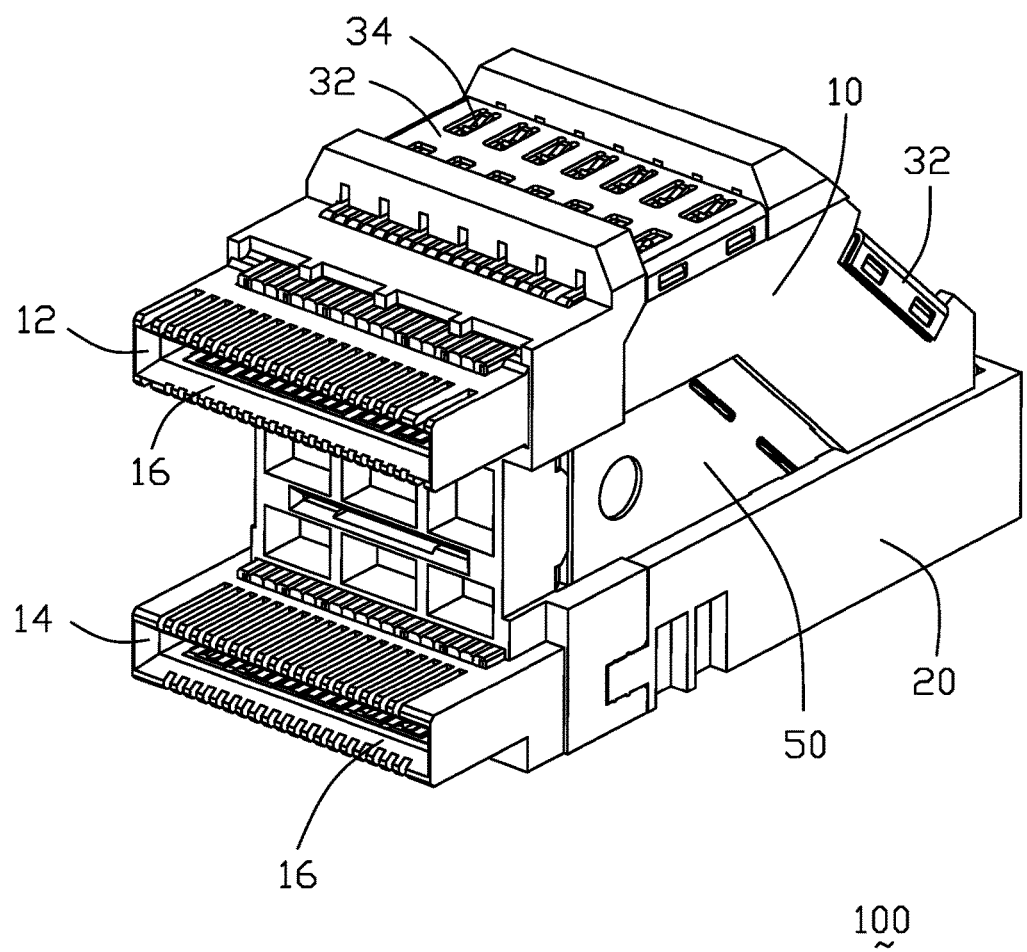
FIG. 1(A) is a perspective view of an electrical receptacle connector assembly according to the invention.
Figure 1B:
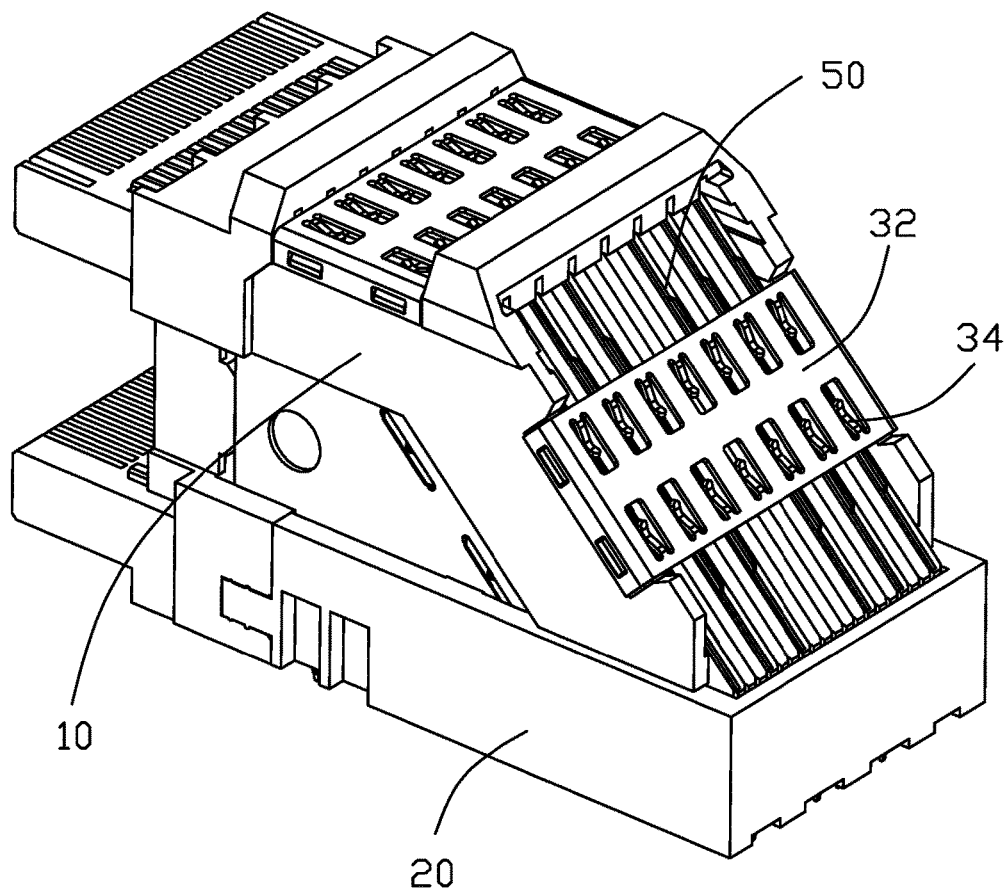
FIG. 1(B) is another perspective view of the electrical receptacle connector assembly of FIG. 1.
Figure 1C:
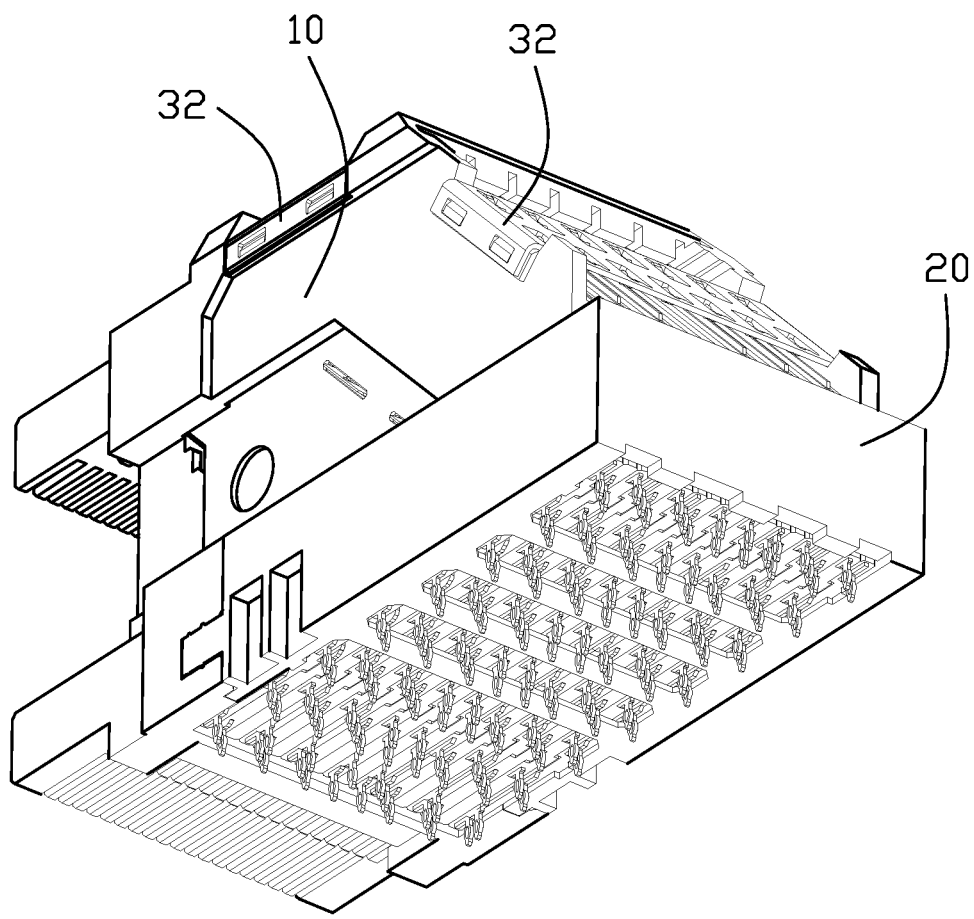
FIG. 1(C) is another perspective view of the electrical receptacle connector assembly of FIG. 1.
Figure 1D:
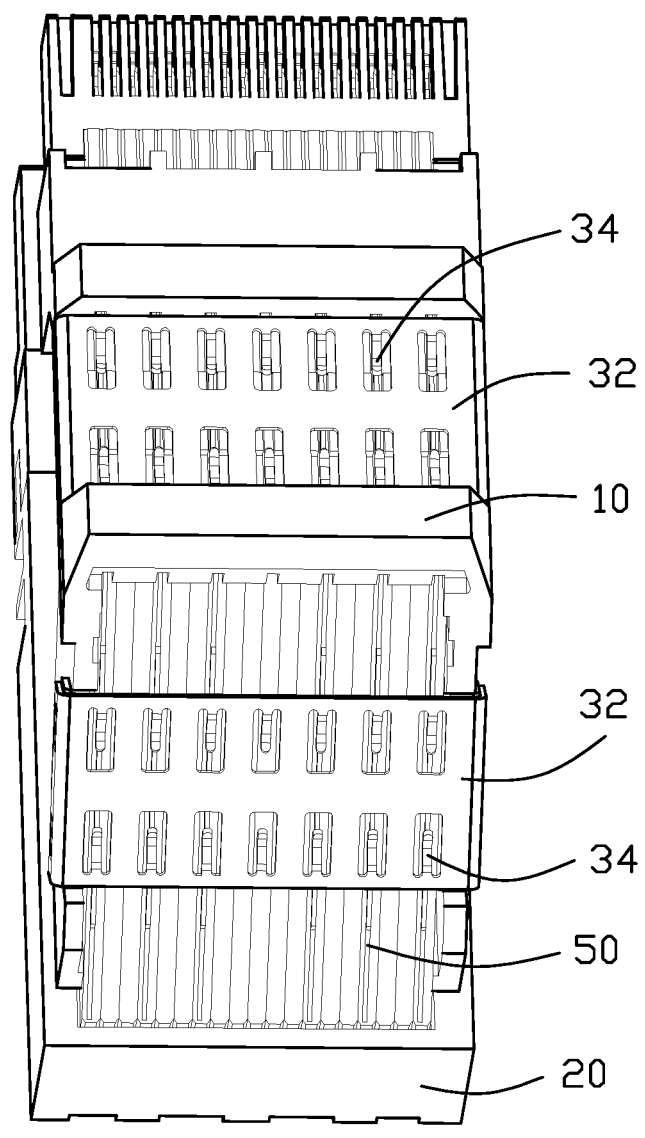
FIG. 1(D) is another perspective view of the electrical receptacle connector assembly of FIG. 1.
Figure 2:
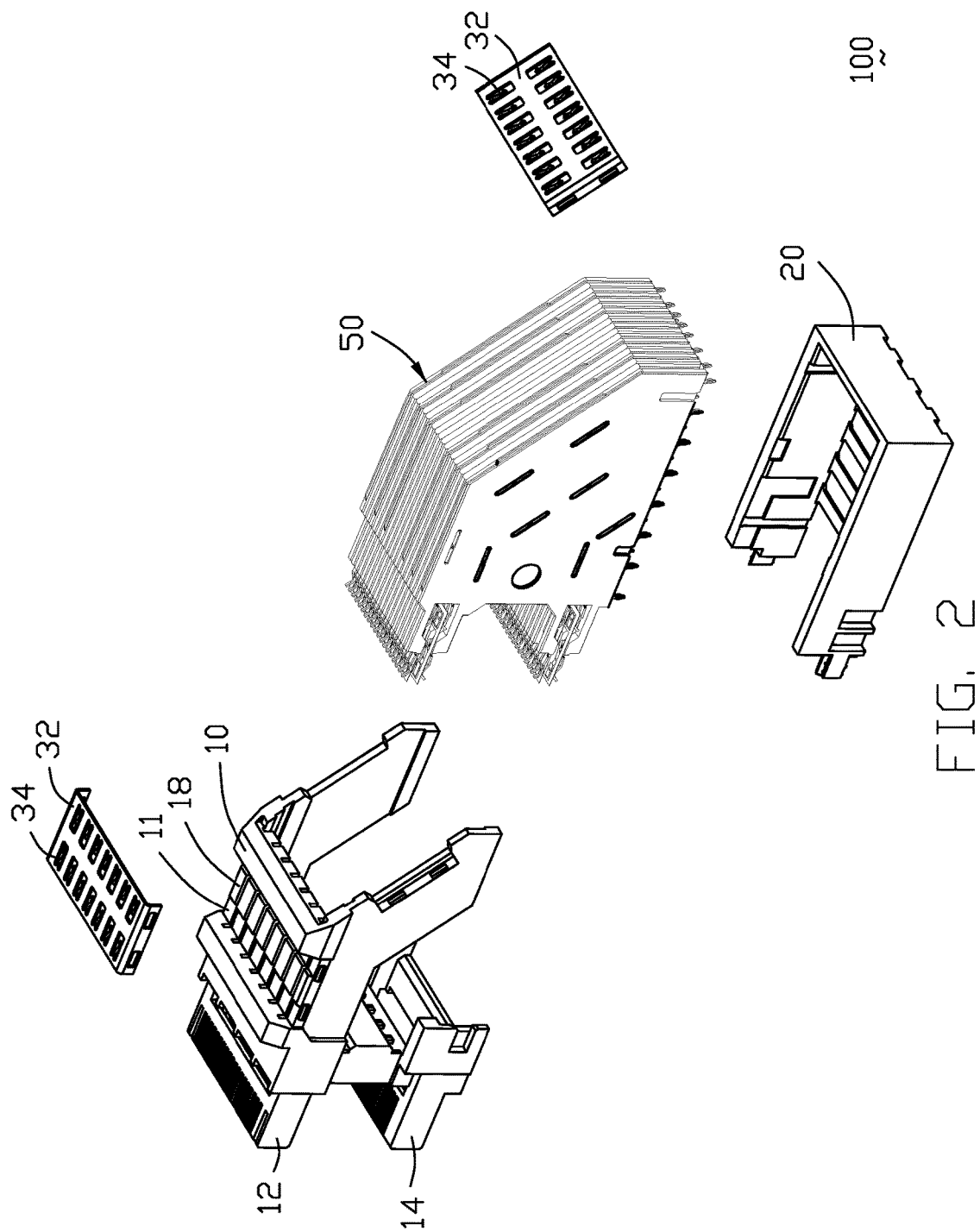
FIG. 2 is an exploded perspective view of the electrical receptacle connector assembly of FIG. 1.
Figure 3A:
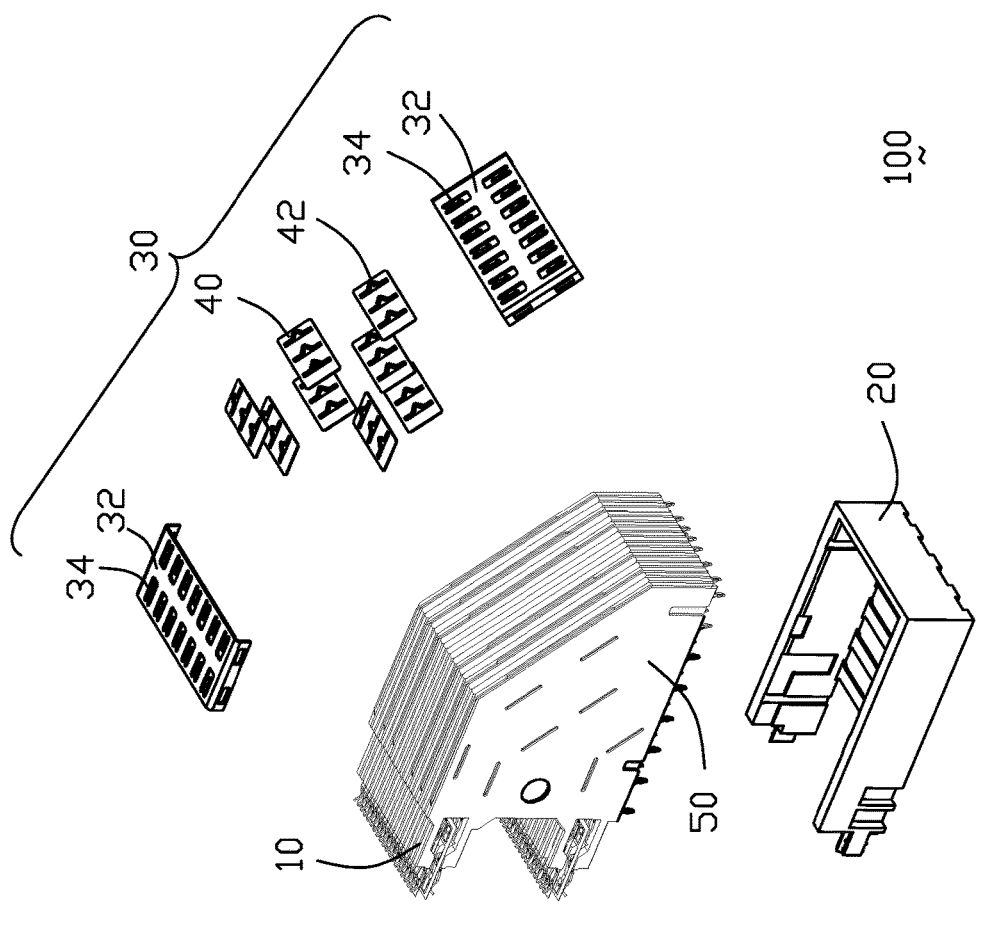
FIG. 3(A) is a further exploded perspective view of an electrical receptacle connector assembly of FIG. 2.
Figure 3A:
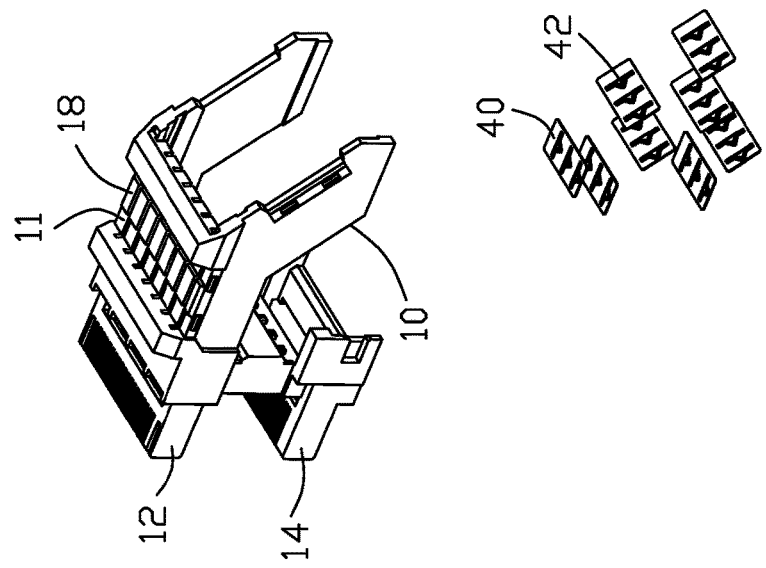
Figure 3B:
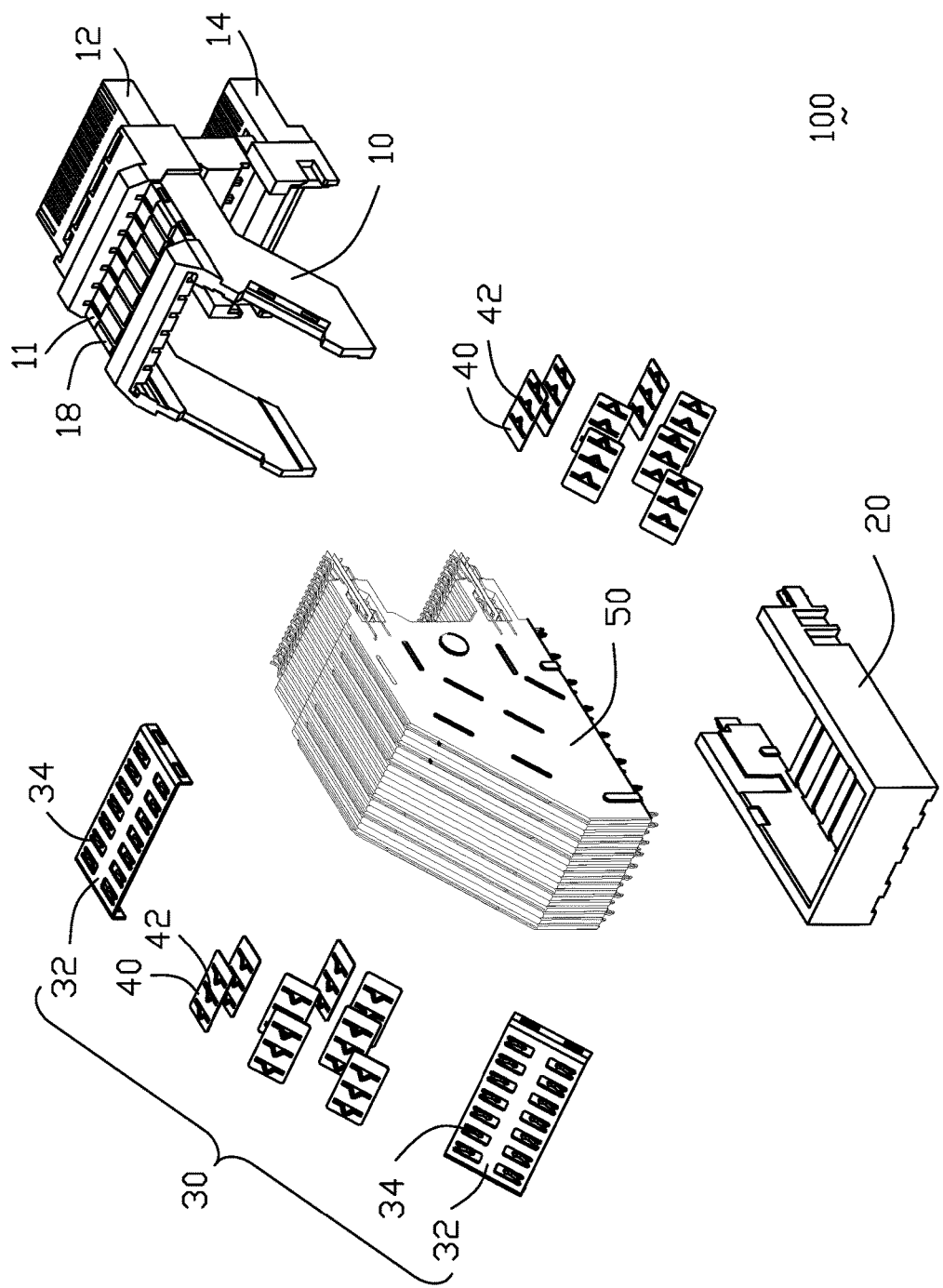
FIG. 3(B) is another exploded perspective view of the electrical receptacle connector assembly of FIG. 3(A)
Figure 4:
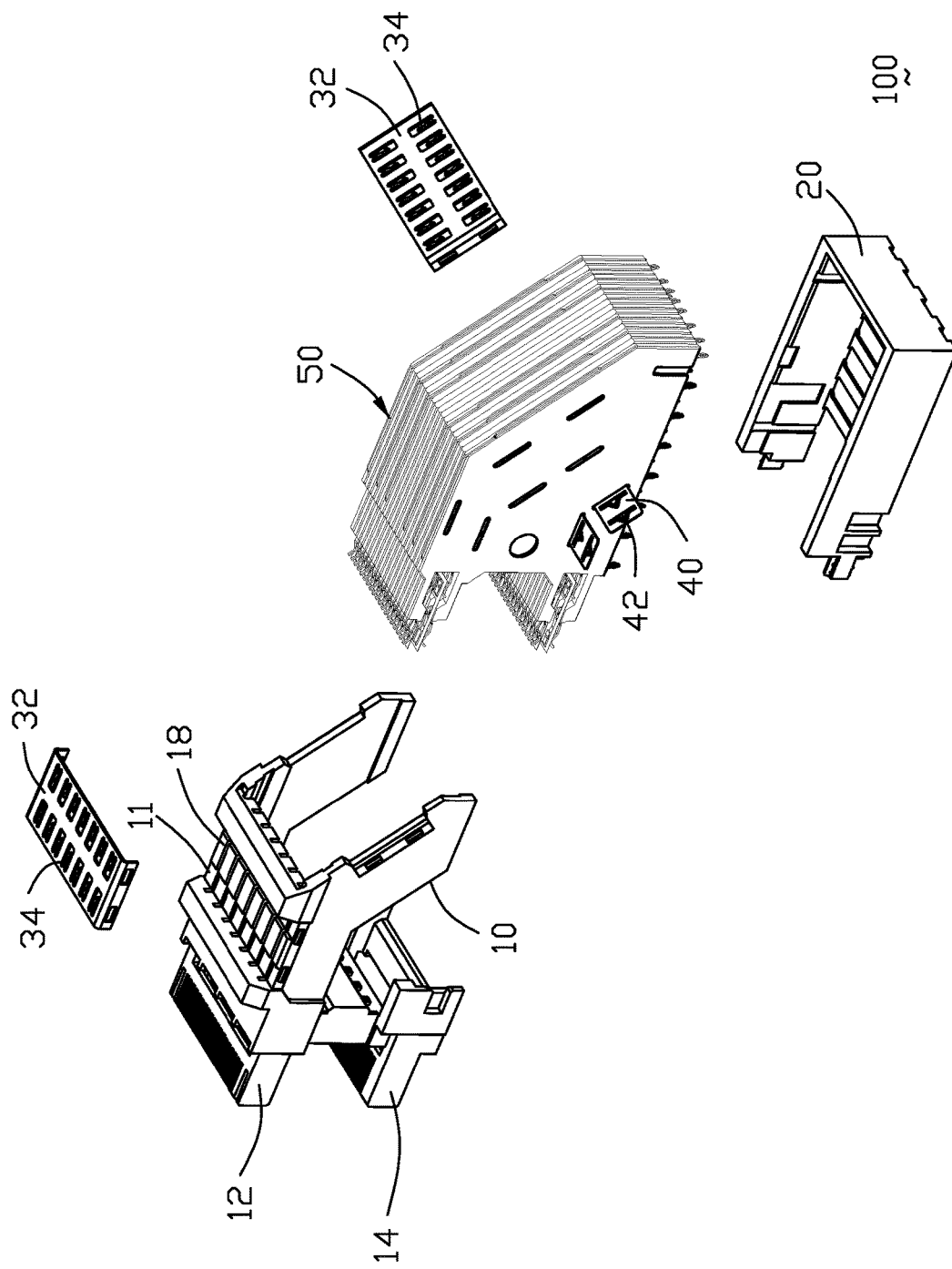
FIG. 4 is a further partially exploded perspective view of the electrical receptacle connector assembly of FIG. 2.
Figure 5A:
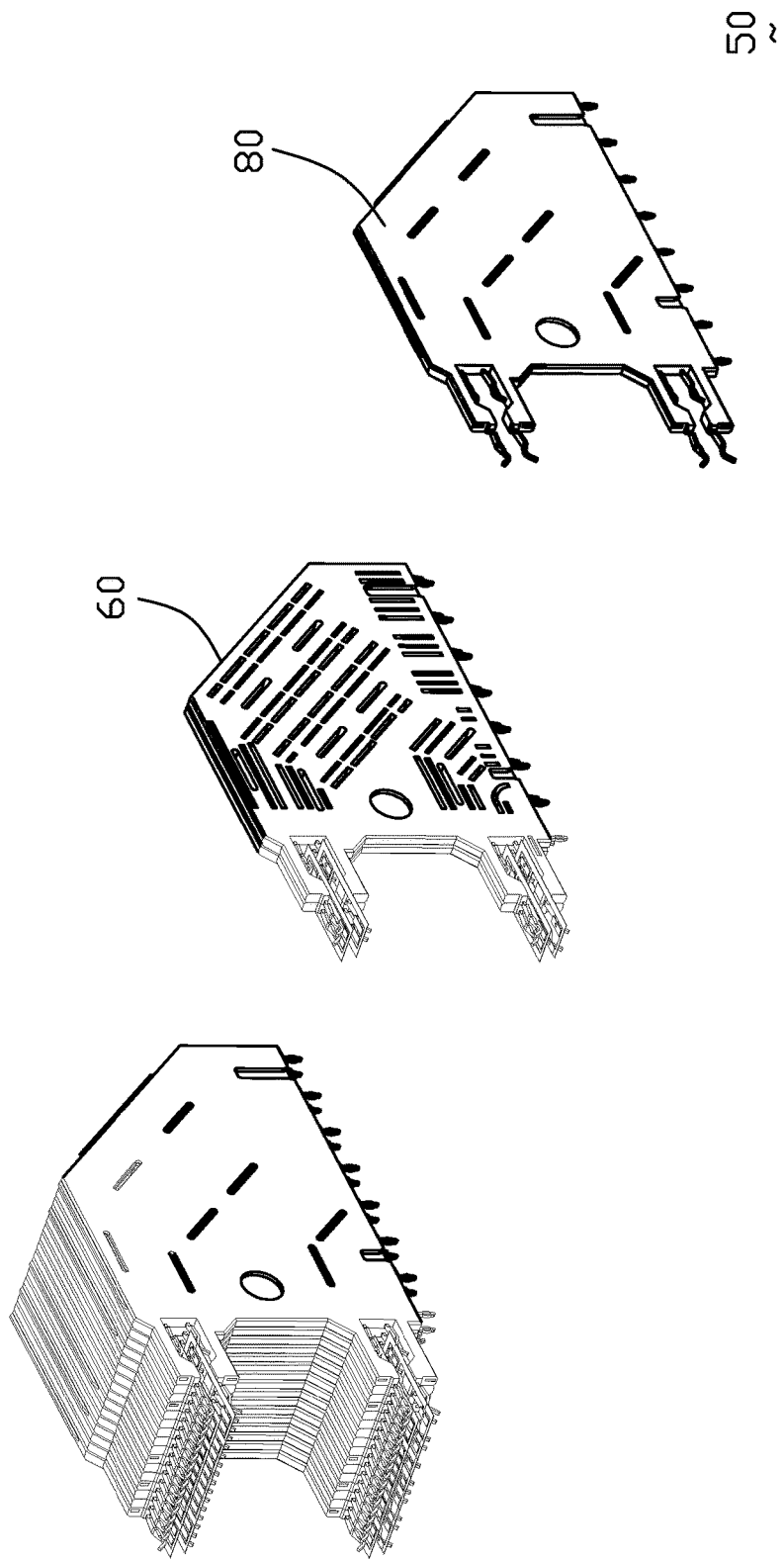
FIG. 5(A) is an exploded perspective view of the contact wafer assembly of the electrical receptacle connector assembly of FIG. 1.
Figure 6A:
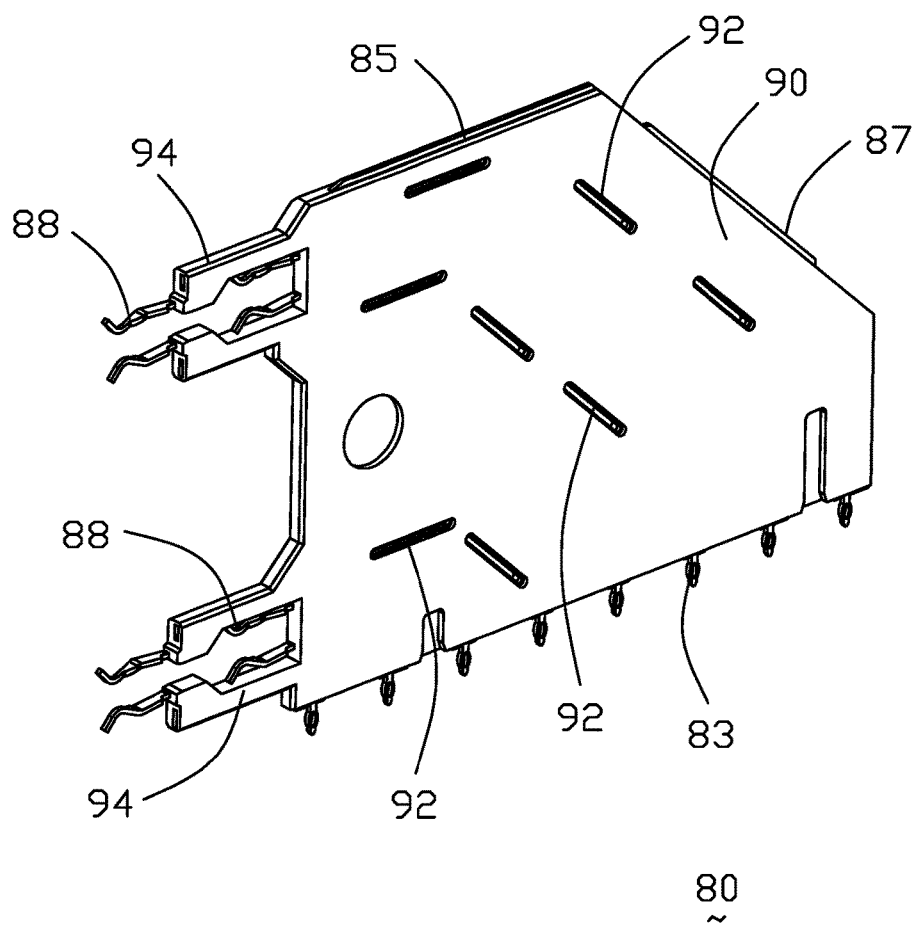
FIG. 6(A) is a perspective view of the ground contact wafer of the contact wafer assembly of FIG. 5(A)
Figure 6B:
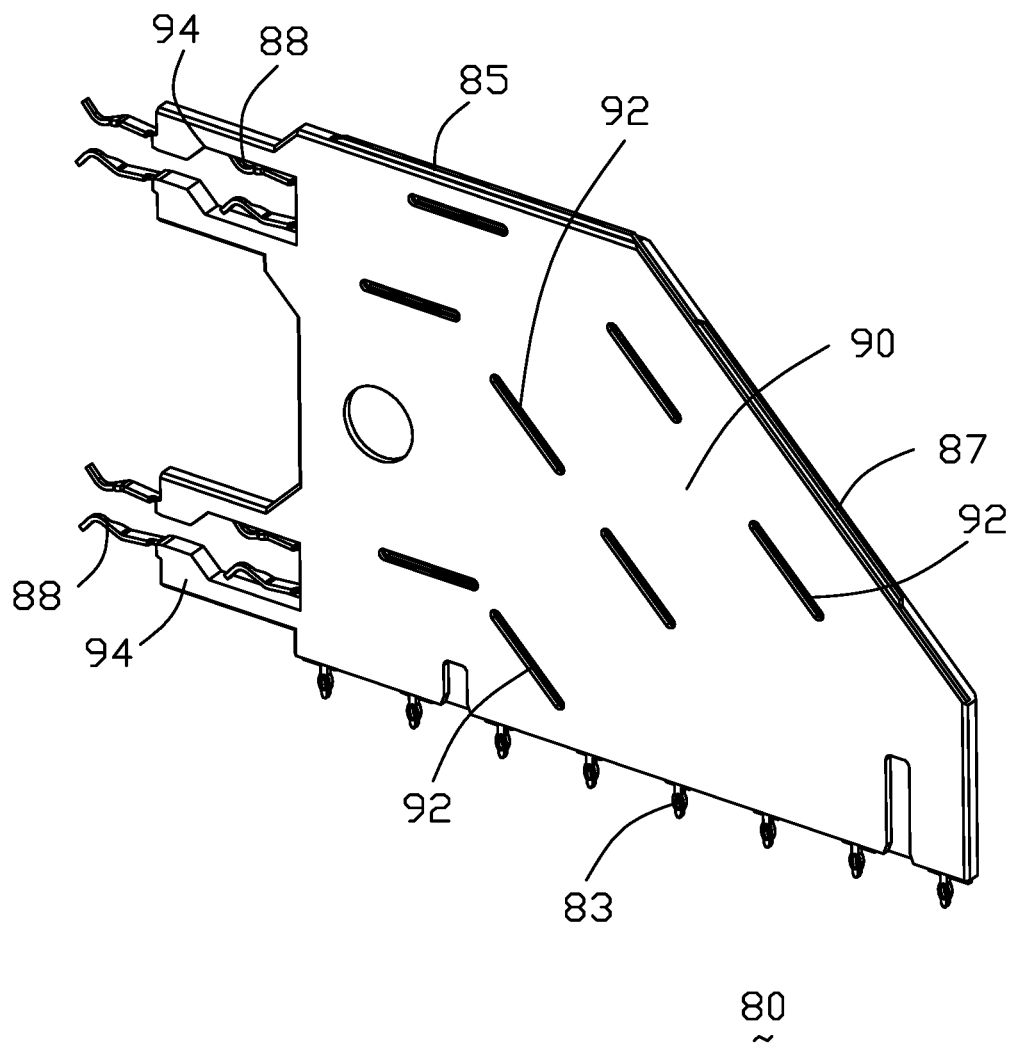
FIG. 6(B) is another perspective view of the ground contact wafer of the contact wafer assembly of 6(A)
Figure 6C:
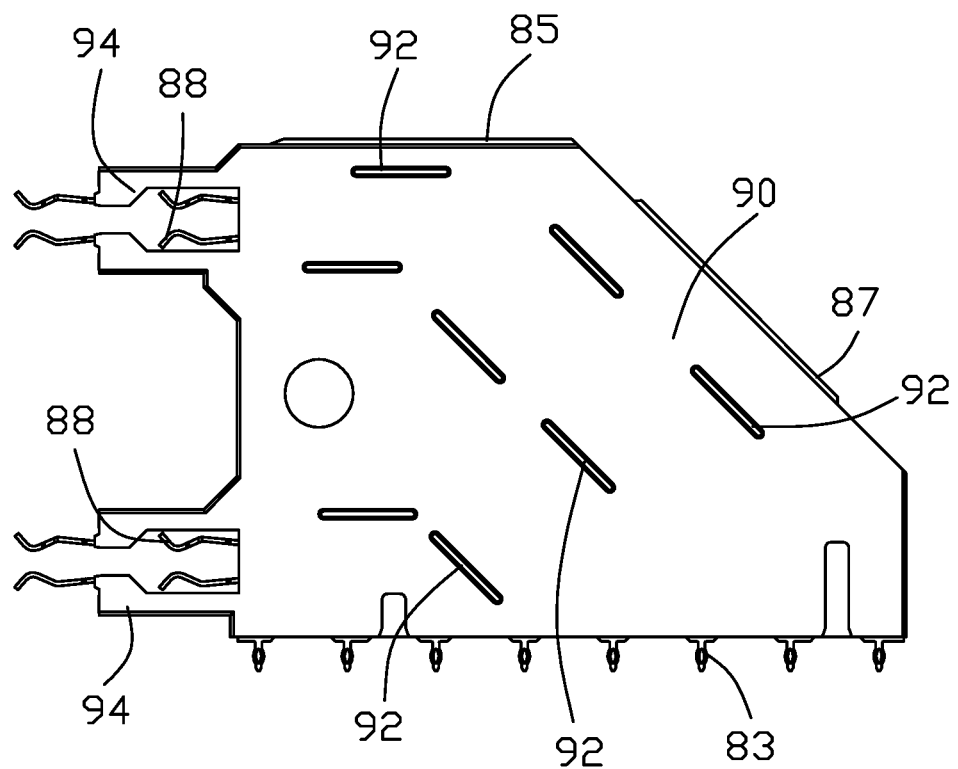
FIG. 6(C) is an elevation view of the ground contact wafer of the contact wafer assembly of FIG. 6(A)
Figure 7A:
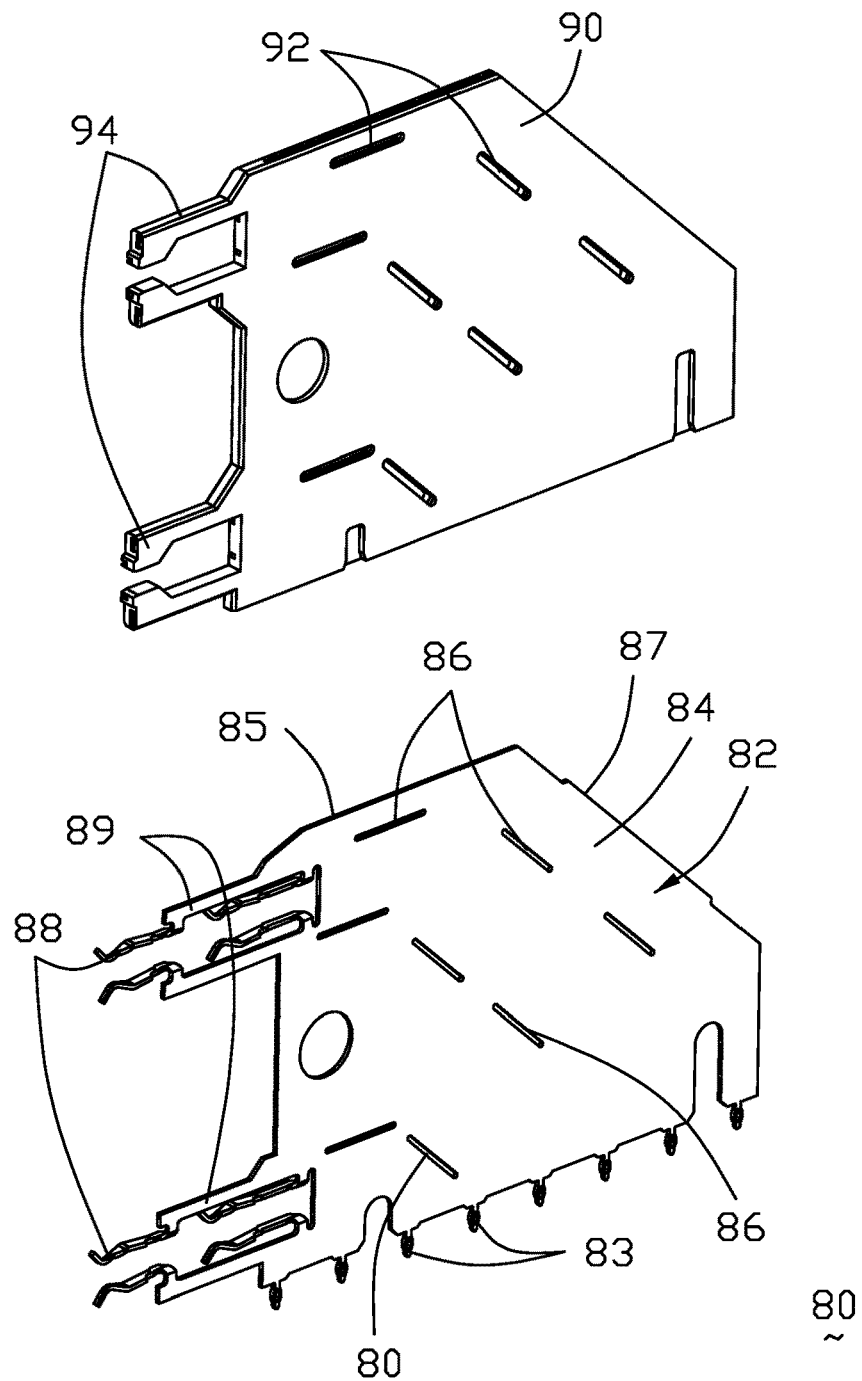
FIG. 7(A) is an exploded perspective view of the ground contact wafer of FIG. 6(A)
Figure 7B:
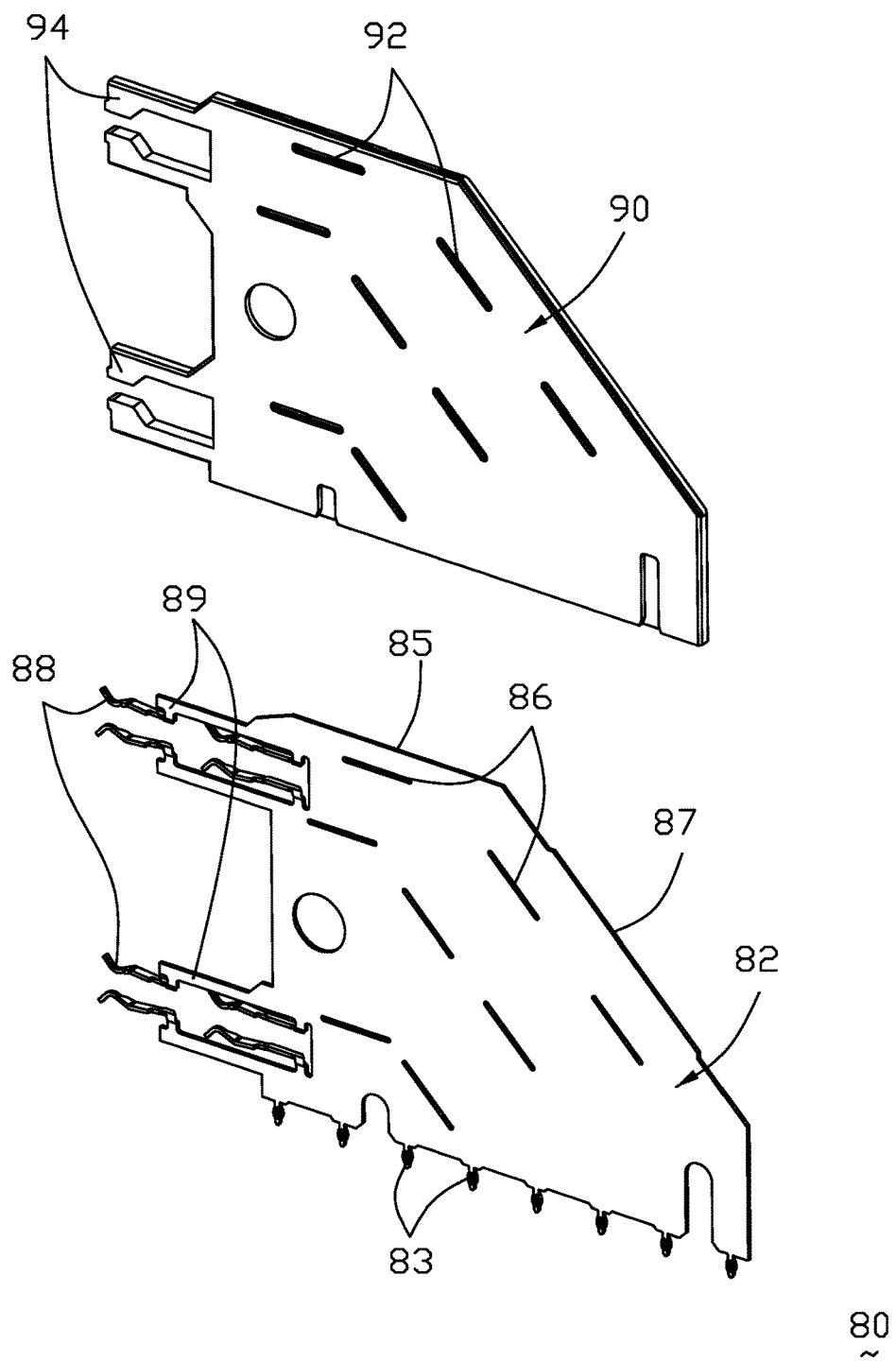
FIG. 7(B) is another exploded perspective view of the ground contact wafer of FIG. 7(A)
Figure 7C:
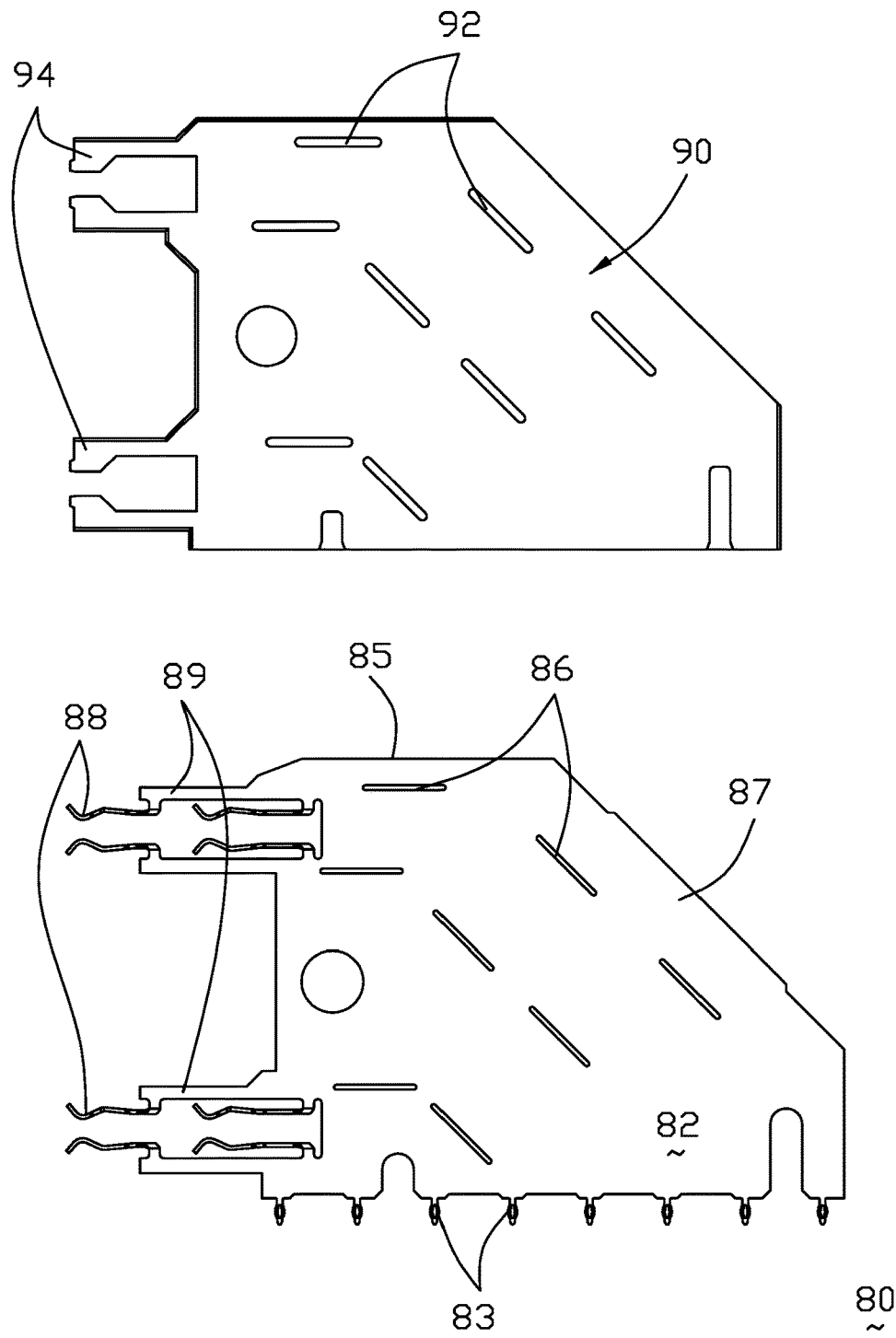
FIG. 7(C) is an elevation view of the ground contact wafer of FIG. 7(A)
Figure 8A:
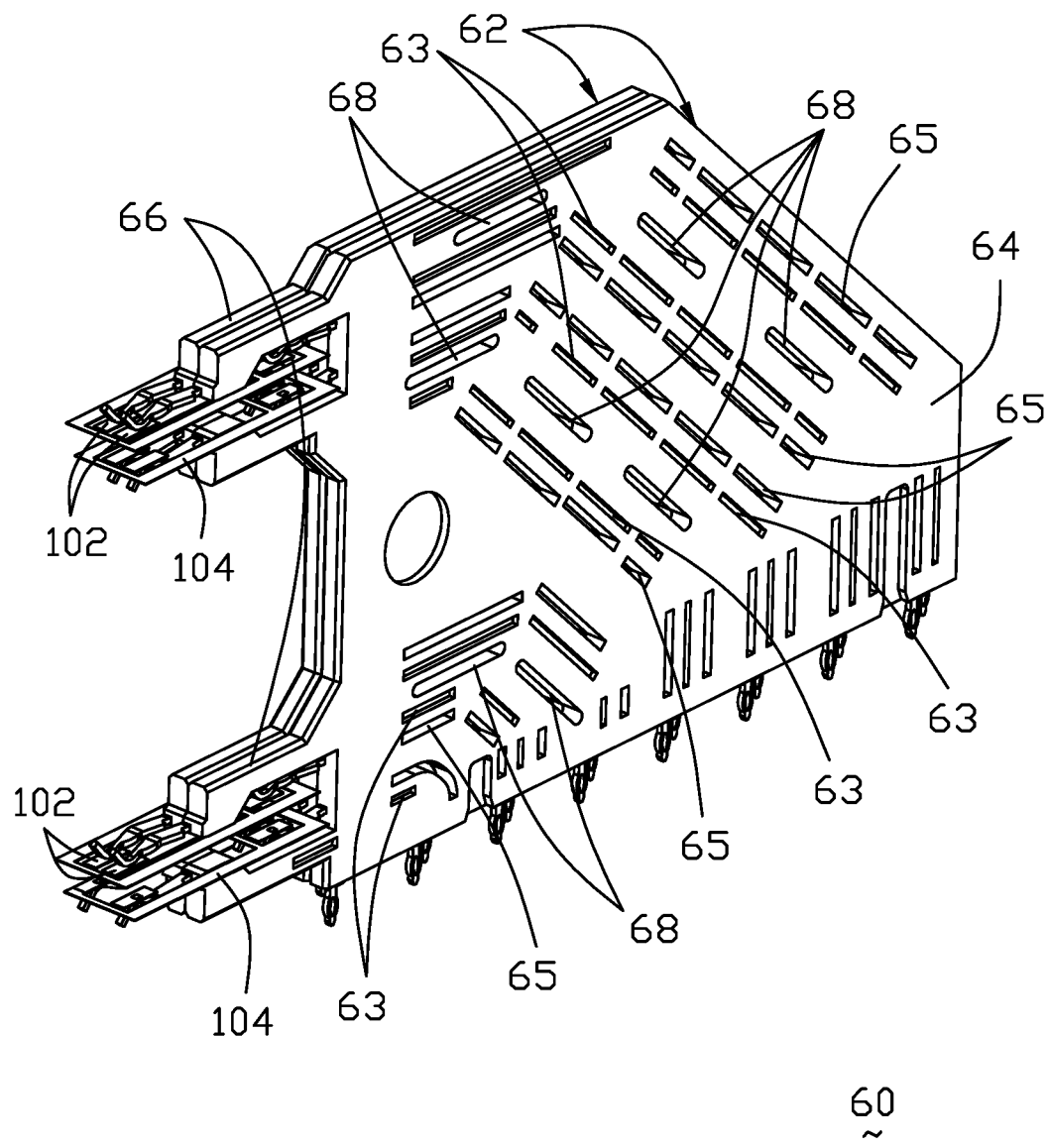
FIG. 8(A) is a perspective view of the signal contact wafer pair of the contact wafer assembly of FIG. 5(A)
Figure 8B:
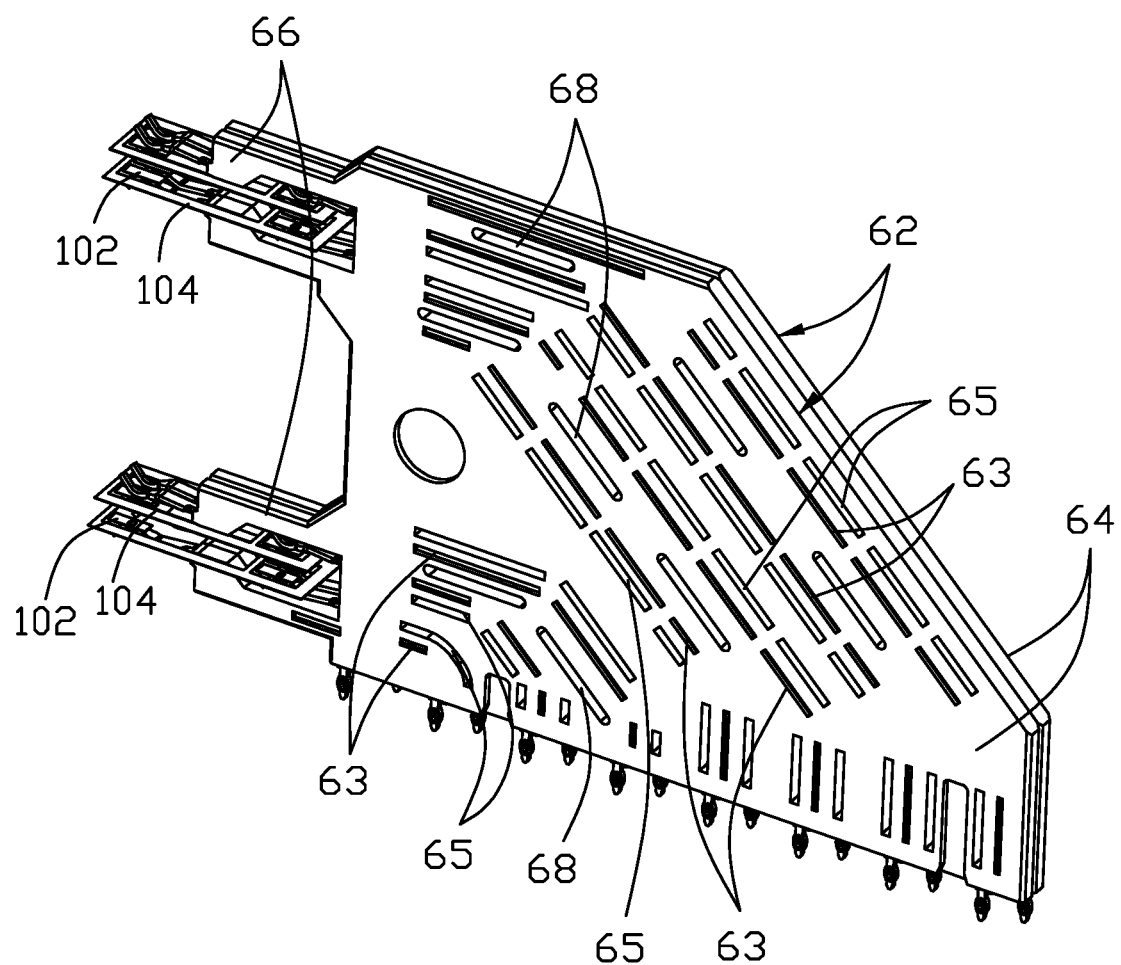
FIG. 8(B) is another perspective view of the signal contact wafer pair of FIG. 8(A)
Figure 8C:
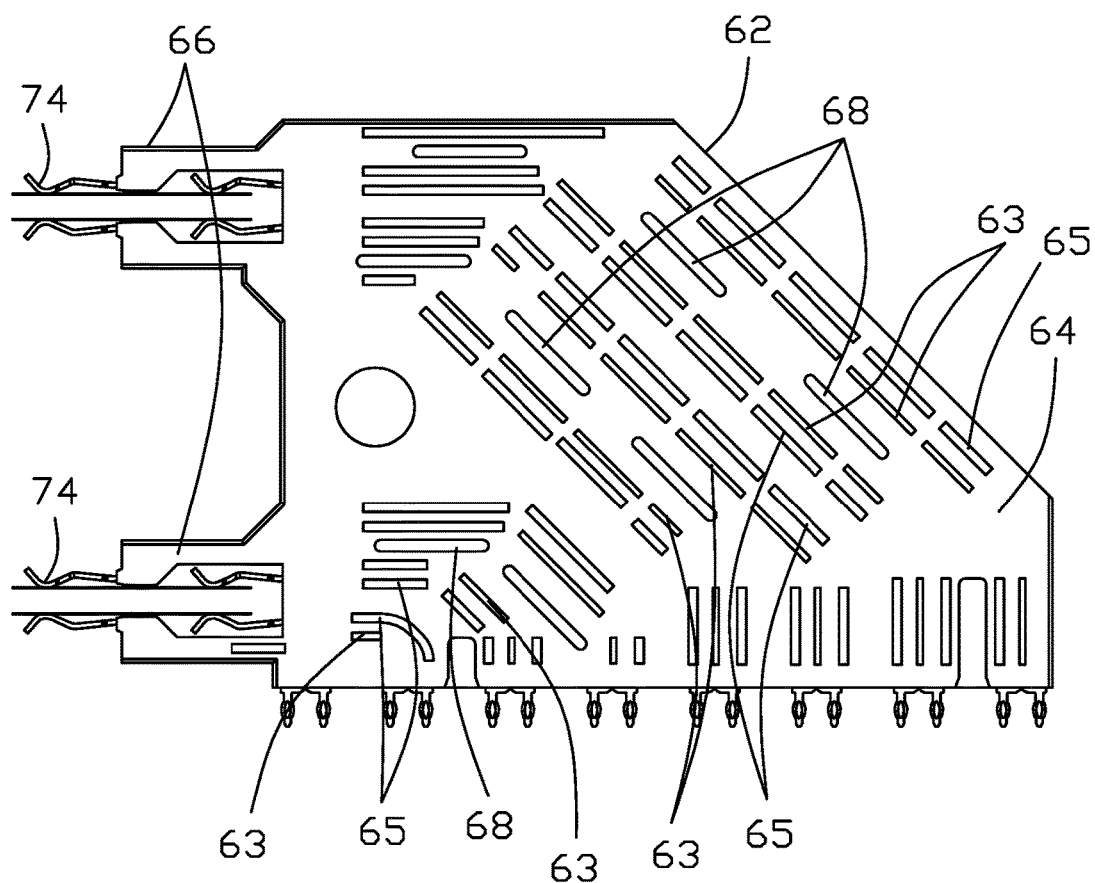
FIG. 8(C) is an elevation view of the signal contact wafer pair of FIG. 8(A)
Figure 8D:
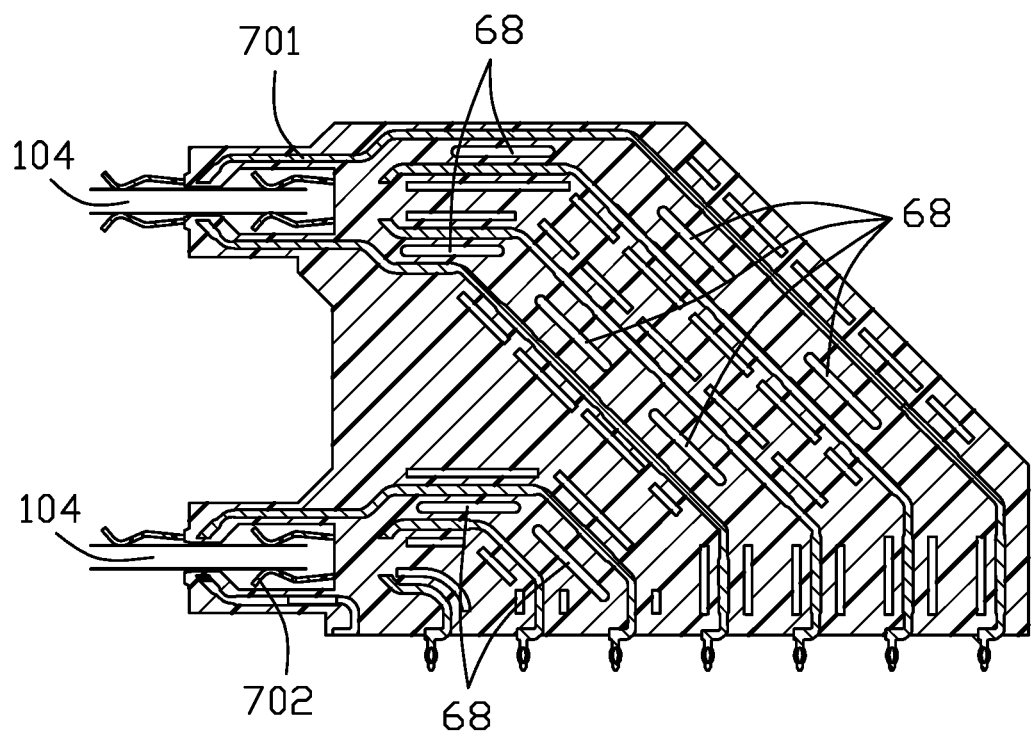
FIG. 8(D) is a cross sectional view of the signal contact wafer pair of FIG. 8(A)
Figure 9:
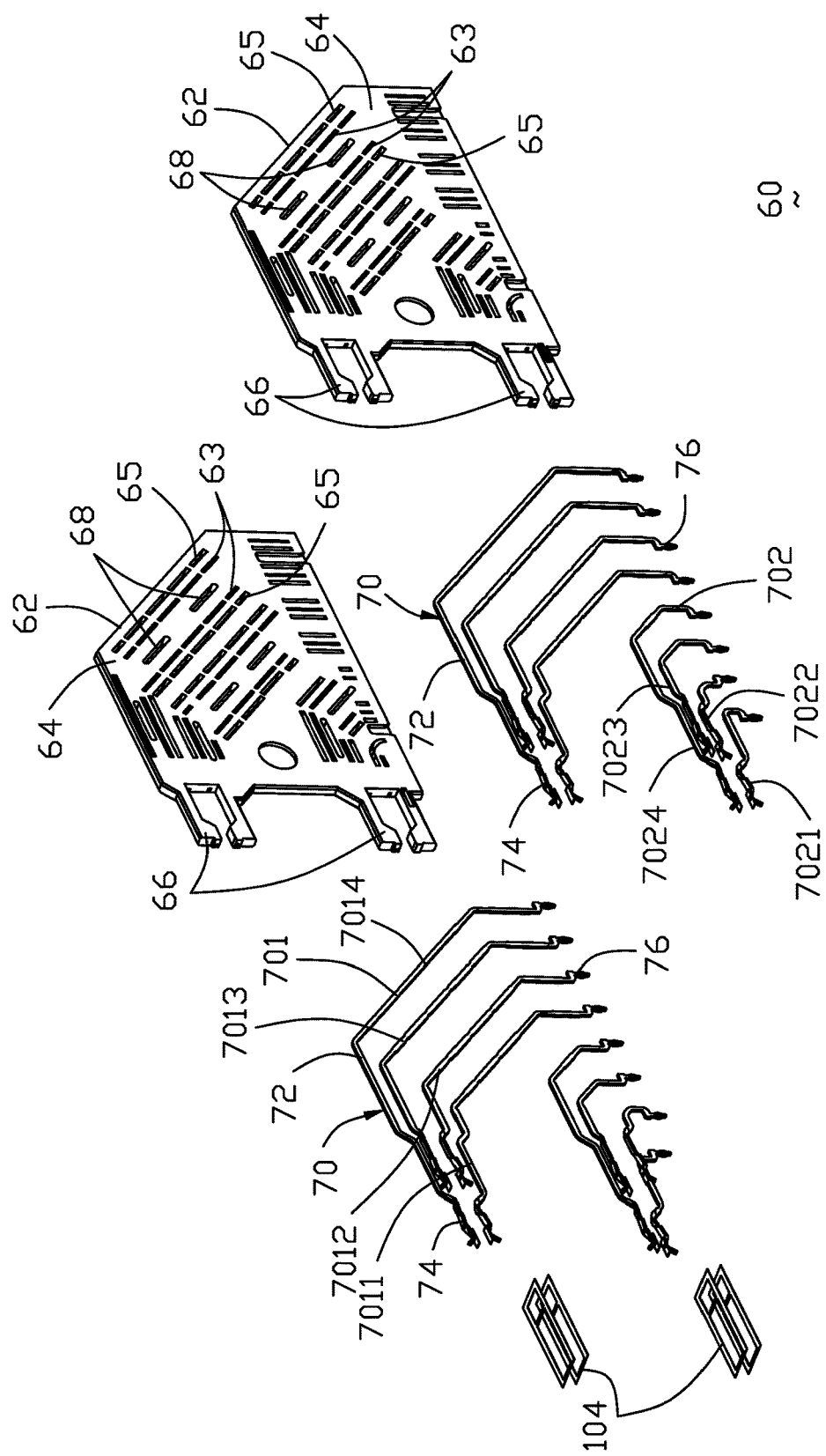
FIG. 9 is an exploded perspective view of the signal contact wafer pair of FIG. 8(A)
Figure 10:
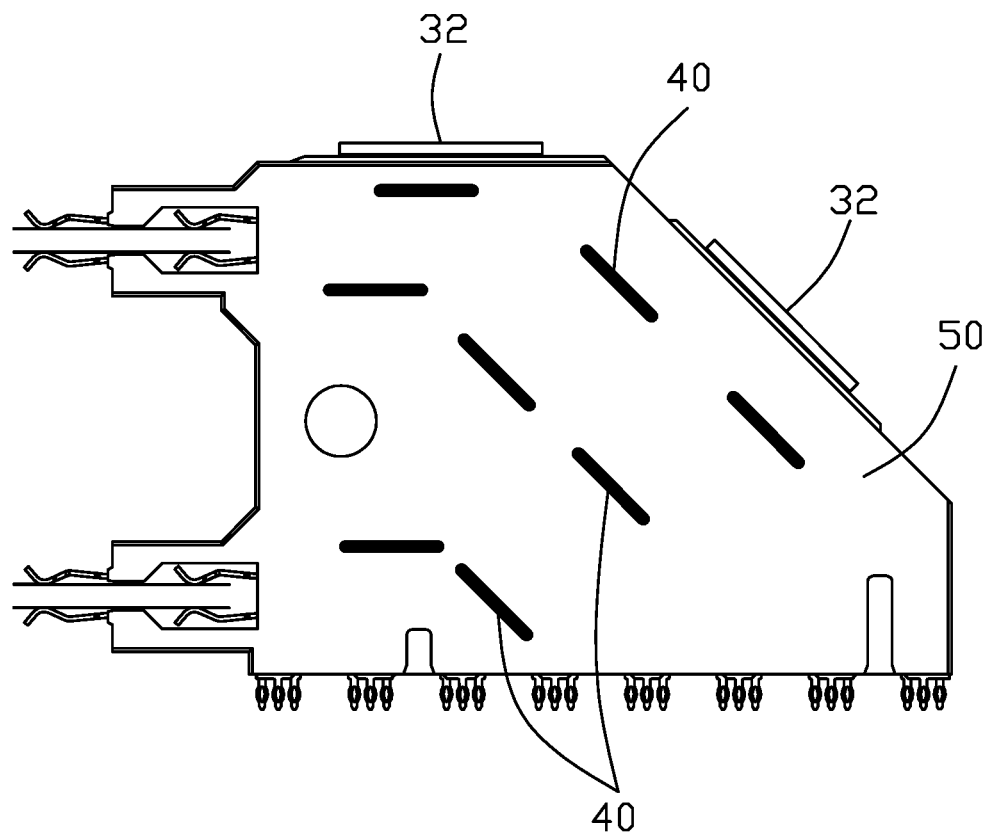
FIG. 10 is a side view of the contact wafer assembly of FIG. 5(A)
Figure 11:
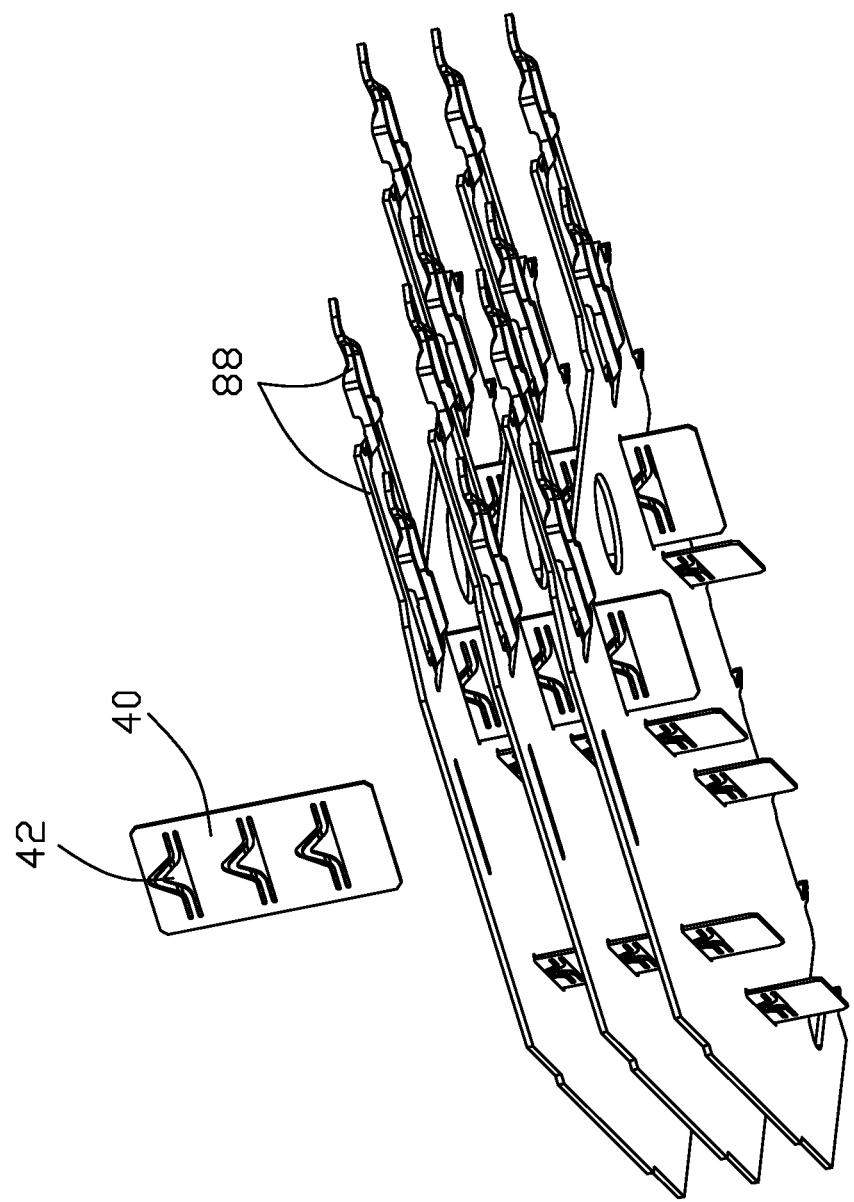
FIG. 11 is a perspective view to show how the spring loaded common ground plates mechanically and electrically connect to the corresponding grounding contacts.

Reference will now be made in detail to the preferred embodiment of the present invention. Referring to FIGS.

1(A) to 11, an electrical receptacle connector 100 includes an insulative main housing 10 forming opposite upper and lower ports 12, 14 in the vertical direction. Each port 12, 14 forms a mating slot 16 forwardly communicating with an exterior in a front-to-back direction perpendicular to the vertical direction for receiving a mating tongue of a plug connector (not completely shown but only corresponding conductive pads thereon) which is generally made by a printed circuit board with the corresponding mating pads on the two opposite surfaces thereof.

A contact wafer assembly 50 is assembled into the main housing 10 from a rear side, includes a plurality of signal contact wafer pairs 60 and a plurality of grounding contact wafers 80, some of which are alternately stacked with each other along the transverse direction perpendicular to the vertical direction and the front-to-back direction.

Each grounding contact wafer 80 includes a grounding contact 82 embedded within a blade insulator 90 via an insert-molding process. The grounding contact 82 has a main plate 84 with a plurality of slits 86 therein, two pairs of contacting arms 88 in each of the two front mating regions 89, and a plurality of mounting legs 83 at the bottom edge. The blade insulator 90 covers both opposite surfaces of the main plate 84 and forms a plurality of slots 92 in aligned with the corresponding slits 86 in the transverse direction, respectively, and forms two mating areas 94 each in alignment with the corresponding mating region 89, around which the contacting arms 88 extend. The main plate 84 forms an upper ridge 85 and the rear ridge 87 respectively projecting out of the upper edge and the rear edge of the blade insulator 90.

The signal contact wafer pairs 60 includes two wafers 62 each of which includes an blade insulator 64 with eight signal contacts 70 embedded therein via an insert-molding process. The eight signal contacts 70 are divided into upper contacts 701 and lower contacts 702 spaced apart from the upper contacts 701 along vertical direction. The upper contacts 701 comprises a first front lower contact 7011, a first rear lower contact 7012 disposed over and at a rear of the first front lower contact 7011, a first rear upper contact 7013 disposed over and faced to the first rear lower contact 7012, and a first front upper contact 7014 disposed over the first rear upper contact 7013 and faced to the first front lower contact 7011. The lower contacts 702 comprises a second front lower contact 7021, a second rear lower contact 7022 disposed over and at a rear of the second front lower contact 7021, a second rear upper contact 7023 disposed over and faced to the second rear lower contact 7022, and a second front upper contact 7024 disposed over the second rear upper contact 7023 and faced to the second front lower contact 7021. The insulator 64 forms two front mating areas 66 and a plurality of slots 68 in alignment with the slots 92 of the neighboring ground contact wafer 80. The signal contacts 70 have different configurations and dimensions for complying with different positions. Each of the signal contacts 70 includes a main body 72 embedded within the insulator 64, a front contacting arm 74 exposed in the corresponding mating area 66, a bottom mounting leg 76 exposed under the bottom edge of the blade insulator 64. The insulator 64 further has a plurality of first slots 63 to expose the corresponding signal contact 70 in the transverse direction, and a plurality of second slots 65 by two sides of the first slots 63 for thermal consideration either in molding or in operation. It should be noted in the drawings, the conductive pads of the plug connector including respective signal pads 102 and the frame like grounding pads 104 are shown only for comprehension.

The key feature of the invention is related to the spring loaded common ground plate assembly 30. The spring loaded common ground plate assembly 30 includes two types, i.e., the interior type and the exterior type. The exterior type spring loaded common ground plate 32 is assembled upon the main housing 10 and latched with the main housing 10 with the springs 34 abutting against the ridges 85, 87 of the grounding contact 82. The exterior type spring loaded common ground plate 32 is disposed over the first front upper contact 7014. The interior type spring loaded common ground plate 40 is inserted into all the aligned slots 92, slits 82 and slots 68 with the corresponding springs 42 mechanically and electrically connected to the corresponding grounding contact 82 within the slits 86.

In this embodiment, there are two exterior type spring loaded common ground plates 32 either at a top or at a rear of each main plate 84 of the grounding contact 82. There are eight interior type spring loaded common ground plates 40 for each of signal contact wafer pairs 60 and divided into three groups, with one group comprising two interior type spring loaded common ground plates 40 and the other two groups both comprising three interior type spring loaded common ground plates 40. Three of the interior type spring loaded common ground plates 40 are disposed between the first front lower contacts 7011 and the first rear lower contacts 7012. Three interior type spring loaded common ground plates 40 are disposed between the first rear upper contacts 7013 and the first front upper contacts 7014. Two interior type spring loaded common ground plates 40 are disposed between the second rear upper contacts 7023 and the second front upper contact 7024. The main housing 10 further forms a plurality of slits 18 to receive the corresponding upper ridges 85 wherein the two recesses 11 expose the upper ridges 85 for contacting the corresponding springs 34.

Similar to the structures disclosed in the previous provisional applications, a base housing 20 is assembled to the main housing 10, and the exterior spring loaded common ground plates 32 are assembled to the main housing 10 after the contact wafer assembly 50 is assembled into the main housing 10. In this embodiment, the base housing 20 is assembled to the main housing 10 after the contact wafer assembly 50 is assembled into the main housing 10 and the spring loaded common ground plates 32 are inserted into the contact wafer assembly 50. Anyhow, in other embodiments, it is possible to have the base housing 20 firstly hold the contact wafer assembly 50 and commonly assembled to the main housing 10, and have the spring loaded common ground plates inserted into the contact wafer assembly 50 at last. Or the spring loaded common ground plates are firstly inserted into the contact wafer assembly and later held by the base housing 20 and lastly commonly assembled to the main housing 10. Notably, the contacting arms 74 of the signal contacts 70 and the contacting arms 66 of the grounding contact 82 are exposed in the corresponding mating slot 16.

One feature of the invention is to have the spring 42 be in a triangular configuration with an apex extending in the transverse direction which is compliant/same with the insertion direction of the interior type common ground plate 40 for facilitating assembling. The spring 42 also extends in a plane oblique to and away from another plane defined by the common ground plate 40 with a tiny angle therebetween so as to result in deflection for enhancing contacting the corresponding grounding contacts 82 in the slits 86. Another feature of the invention is that the interior type spring loaded common ground plates 40 are inwardly inserted into the corresponding slit structures from two (right and left) sides of the wafer assembly in an opposite way. Thus, the direction along which the apex extends on the left side of the wafer assembly is opposite to that the apex extends on the right side of the wafer assembly. This arrangement is to shorten the common ground plate in the transverse direction for manufacturability thereof.

What is claimed is:

1. An electrical receptacle connector assembly comprising:
a main housing defining upper and lower mating ports opposite to each other in a vertical direction, each of said upper and lower mating ports forwardly communicating with an exterior in a front-to-back direction perpendicular to the vertical direction; and
a contact wafer assembly assembled to the main housing and including a plurality of grounding contact wafers and a plurality of signal contact wafer pairs alternately stacked with one another along a transverse direction perpendicular to both said vertical direction and said front-to-back direction, each of said grounding contact wafers including a grounding contact embedded within an insulator and each of said signal contact wafer pair including a plurality of signal contacts embedded within an insulator; wherein
the grounding contact includes a main plate with contacting arms unitarily extending forwardly therefrom, the main plate has at least one ridge extending beyond a periphery of the corresponding insulator, and a spring loaded common ground plate is attached upon the main housing with corresponding springs mechanically and electrically connecting to the ridges of the corresponding grounding contacts, respectively.

2. The electrical receptacle connector assembly as claimed in claim 1, wherein said spring loaded common ground plate is assembled to the main housing in a direction parallel to a vertical plane defined by each wafer.

3. The electrical receptacle connector assembly as claimed in claim 1, wherein said ridge is either at a top or at a rear of each main plate.

4. The electrical receptacle connector assembly as claimed in claim 1, wherein said spring loaded common ground plate is latched with the main housing.

5. An electrical connector assembly comprising:
a main housing defining a mating port in a front-to-back direction; and
a contact wafer assembly assembled to the main housing along the front-to-back direction, and including a plurality of grounding contact wafers and a plurality of signal contact wafer pairs alternately stacked with one another along a transverse direction perpendicular to both said vertical direction and said front-to-back direction, each of said grounding contact wafers including a grounding contact embedded within an insulator and each of said signal contact wafer pair including a plurality of signal contacts embedded within another insulator; wherein
said contact wafer assembly defines a plurality of slit structures extending therethrough in the transverse direction, and a plurality of interior type spring loaded common ground plates are inserted into the corresponding slit structures in the transverse direction with corresponding springs to mechanically and electrically connect to the corresponding grounding contacts, respectively; wherein
each of said interior type spring loaded common ground plates extends in a plane with a corresponding spring extending therefrom wherein said spring is essentially of a triangular configuration with a free apex extending along both the transverse direction, and said spring extends in a plane slightly oblique to and away from another plane defined by the common ground plate with a minor angle therebetween.

6. The electrical connector assembly as claimed in claim 5, wherein said another insulator of each of said signal contact wafer pair forms a first slot to expose the signal contact in the transverse direction, a second slot for thermal consideration either in molding or in operation, and a third slot to be a part of the slit structure for receiving the corresponding interior type spring loaded common ground plate therein.

7. The electrical connector assembly as claimed in claim 5, wherein the interior type spring loaded common ground plates are of two groups respectively assembled to the corresponding slit structure from two lateral sides of the contact wafer assembly in opposite directions toward each other.

8. The electrical connector assembly as claimed in claim 7, wherein the apex of one common ground plate on one lateral side of the contact wafer assembly extends in a first transverse direction which is opposite to a second transverse direction along which an apex of another common ground plate on the other lateral sides of the contact wafer assembly.

9. An electrical receptacle connector assembly including:
a main housing defining upper and lower mating ports opposite to each other in a vertical direction, each of said upper and lower mating ports forwardly communicating with an exterior in a front-to-back direction perpendicular to the vertical direction; and
a contact wafer assembly assembled to the main housing and including a plurality of grounding contact wafers and a plurality of signal contact wafer pairs alternately stacked with one another along a transverse direction perpendicular to both said vertical direction and said front-to-back direction, each of said grounding contact wafers including a grounding contact embedded within an insulator and each of said signal contact wafer pair including a plurality of signal contacts embedded within an insulator; wherein
said contact wafer assembly defines a plurality of slit structures extending therethrough in the transverse direction, and a plurality of interior type spring loaded common ground plates are inserted into the corresponding slit structures in the transverse direction with corresponding springs to mechanically and electrically connect to the corresponding grounding contacts, respectively.

10. The electrical receptacle connector assembly as claimed in claim 9, wherein the insulator has a plurality of first slots to expose the corresponding signal contacts in the transverse direction.

11. The electrical receptacle connector assembly as claimed in claim 9, wherein the insulator has a plurality of second slots by two sides of the first slots for thermal consideration either in molding or in operation.

12. The electrical receptacle connector assembly as claimed in claim 9, wherein in each of said grounding contact wafer the insulator forms a plurality of slots and the grounding contact includes a main plate forming a plurality of slits in alignment with the corresponding slots in the transverse direction to receive the corresponding spring loaded common ground plates, respectively.

13. The electrical receptacle connector assembly as claimed in claim 12, wherein each interior type spring loaded common ground plates includes a plurality of springs respectively contacting the corresponding grounding contacts in the corresponding slits, respectively.

14. The electrical receptacle connector assembly as claimed in claim 12, wherein in each of said signal contact wafer pair the insulator forms a plurality of slots in alignment with the corresponding slots of the insulator of the neighboring grounding contact wafer, respectively, in the transverse direction.

15. The electrical receptacle connector assembly as claimed in claim 14, further including a plurality of exterior type spring loaded common ground plates attached upon the main housing with corresponding springs to mechanically and electrically connect corresponding ridges of the grounding contacts, respectively.

16. The electrical receptacle connector assembly as claimed in claim 15, wherein the each of the signal contact wafer comprises upper contacts and lower contacts spaced apart from the upper contacts along vertical direction, the upper contacts comprising a first front lower contact, a first rear lower contact disposed over and at a rear of the first front lower contact, a first rear upper contact disposed over and faced to the first rear lower contact, and a first front upper contact disposed over the first rear upper contact and faced to the first front lower contact, the lower contacts comprising a second front lower contact, a second rear lower contact disposed over and at a rear of the second front lower contact, a second rear upper contact disposed over and faced to the second rear lower contact, and a second front upper contact disposed over the second rear upper contact and faced to the second front lower contact.

17. The electrical receptacle connector assembly as claimed in claim 16, wherein the exterior type spring loaded common ground plates are disposed over the first front upper contact.

18. The electrical receptacle connector assembly as claimed in claim 16, wherein at least one of the interior type spring loaded common ground plates is disposed between the first front lower contacts and the first rear lower contacts.

19. The electrical receptacle connector assembly as claimed in claim 16, wherein at least one of the interior type spring loaded common ground plates is disposed between the first rear upper contacts and the first front upper contacts.

20. The electrical receptacle connector assembly as claimed in claim 16, wherein at least one of the interior type spring loaded common ground plates is disposed between the second rear upper contacts and the second front upper contact.

* * * * *